United States Patent
Gopalraja et al.

[11] Patent Number: 6,146,508
[45] Date of Patent: *Nov. 14, 2000

[54] SPUTTERING METHOD AND APPARATUS WITH SMALL DIAMETER RF COIL

[75] Inventors: Praburam Gopalraja, Sunnyvale; Zheng Xu, Foster City; Ralf Hofmann, San Jose, all of Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/064,355

[22] Filed: Apr. 22, 1998

[51] Int. Cl.$^7$ ...................................................... C23C 14/34
[52] U.S. Cl. .............................. 204/298.06; 204/298.08; 204/192.12
[58] Field of Search ........................ 204/298.08, 298.06; 156/345; 118/723 I

[56] References Cited

U.S. PATENT DOCUMENTS

| | | | |
|---|---|---|---|
| 3,619,402 | 11/1971 | Wurm et al. | 204/298 |
| 3,730,867 | 5/1973 | Albers et al. | 204/298.08 |

(List continued on next page.)

FOREIGN PATENT DOCUMENTS

| | | |
|---|---|---|
| 0520519 | 12/1992 | European Pat. Off. . |
| 0653776 | 10/1994 | European Pat. Off. . |
| 0653776 | 5/1995 | European Pat. Off. . |
| 0727923 | 2/1996 | European Pat. Off. . |
| 0727807 | 8/1996 | European Pat. Off. . |
| 0758148 | 8/1996 | European Pat. Off. . |
| 0807954 | 11/1997 | European Pat. Off. . |
| 59-190363 | 10/1984 | Japan . |
| 61-190070 | 8/1986 | Japan . |
| 6232055 | 8/1994 | Japan . |
| 6283470 | 10/1994 | Japan . |
| 7176398 | 7/1995 | Japan . |
| 7176399 | 7/1995 | Japan . |
| 8-153712 | 6/1996 | Japan . |
| 8288259 | 11/1996 | Japan . |
| 2162365 | 1/1986 | United Kingdom . |
| 2231197 | 11/1990 | United Kingdom . |
| 8606923 | 11/1986 | WIPO . |
| 92/07969 | 5/1992 | WIPO . |
| 9742648 | 11/1997 | WIPO . |
| 9852207 | 11/1998 | WIPO . |

OTHER PUBLICATIONS

D.B. Hayden et al., "Characterization of magnetron–sputtered partially ionized aluminum deposition," J. Vac. Sci. Technol. SA 16(2), 624–627, Mar. 1998.

Jochen M. Schneider et al., "Crystalline alumina deposited at low temperatures by ionized magnetron sputtering," J. Vac. Sci. Technol. A 15(3), pp. 1084–1088, May 1997.

U.S. patent application Ser. No. 08/559,345, filed Nov. 15, 1995 (Atty. Dk. 938/PVD/DV).

U.S. patent application Ser. No. 08/851,946, filed May 6, 1997 (Atty. Dk. 1390.C1/PVD/DV).

U.S. patent application Ser. No. 09/049,839, filed Mar. 27, 1998 (Atty. Dk. 938.D1).

(List continued on next page.)

Primary Examiner—Nam Nguyen
Assistant Examiner—Gregg Cantelmo
Attorney, Agent, or Firm—Konrad Raynes & Victor

[57] ABSTRACT

An apparatus and method for sputtering ionized material onto a workpiece with the aid of a plasma which ionizes the material, utilizing: a support member having a workpiece support area for supporting a workpiece that has a given diameter; a target constituting a source of material to be sputtered; and a coil located between the target and the workpiece support for creating a plasma which ionizes material sputtered from the target, the coil enclosing a region, the support member being maintained at a potential which causes ionized material to be attracted to the support member. The coil is configured and operated to shape the plasma in a manner to promote redirection of material sputtered from the center of the target back to the target.

24 Claims, 4 Drawing Sheets

U.S. PATENT DOCUMENTS

| | | | |
|---|---|---|---|
| 4,361,472 | 11/1982 | Morrison, Jr. | 204/192.12 |
| 4,422,896 | 12/1983 | Class et al. | 216/67 |
| 4,661,228 | 4/1987 | Mintz | 204/192.25 |
| 4,842,703 | 6/1989 | Class et al. | 204/192.12 |
| 4,844,775 | 7/1989 | Keeble | 156/643 |
| 4,918,031 | 4/1990 | Flamm et al. | 438/695 |
| 4,925,542 | 5/1990 | Kidd | 427/531 |
| 4,941,915 | 7/1990 | Matsuoka et al. | 204/298.12 |
| 4,948,458 | 8/1990 | Ogle | 438/729 |
| 4,990,229 | 2/1991 | Campbell et al. | 204/298.06 |
| 4,999,096 | 3/1991 | Nihei et al. | 204/192.3 |
| 5,102,496 | 4/1992 | Savas | 216/69 |
| 5,122,251 | 6/1992 | Campbell et al. | 204/298.06 |
| 5,135,634 | 8/1992 | Clarke | 204/298.06 |
| 5,146,137 | 9/1992 | Gesche et al. | 315/111.21 |
| 5,175,608 | 12/1992 | Nihei et al. | 257/751 |
| 5,178,739 | 1/1993 | Barnes et al. | 204/298.08 |
| 5,198,725 | 3/1993 | Chen et al. | 204/298.16 |
| 5,231,334 | 7/1993 | Paranjpe | 156/345 |
| 5,234,560 | 8/1993 | Kadlec et al. | 204/192.12 |
| 5,241,245 | 8/1993 | Barnes et al. | 315/111.41 |
| 5,280,154 | 1/1994 | Cuomo et al. | 219/121.52 |
| 5,304,279 | 4/1994 | Coultas et al. | 156/345 |
| 5,346,578 | 9/1994 | Benzing et al. | 156/345 |
| 5,361,016 | 11/1994 | Ohkawa et al. | 315/111.41 |
| 5,397,962 | 3/1995 | Moslehi | 315/111.51 |
| 5,401,350 | 3/1995 | Patrick et al. | 156/345 |
| 5,404,079 | 4/1995 | Ohkuni et al. | 315/111.81 |
| 5,418,431 | 5/1995 | Williamson et al. | 315/111.51 |
| 5,429,070 | 7/1995 | Campbell et al. | 118/723 R |
| 5,429,995 | 7/1995 | Nishiyama et al. | 438/788 |
| 5,430,355 | 7/1995 | Paranjpe | 315/111.21 |
| 5,433,812 | 7/1995 | Cuomo et al. | 156/345 |
| 5,464,476 | 11/1995 | Gibb et al. | 118/723 I |
| 5,503,676 | 4/1996 | Shufflebotham et al. | 118/723 MR |
| 5,525,159 | 6/1996 | Hama et al. | 118/723 I |
| 5,556,501 | 9/1996 | Collins et al. | 156/345 |
| 5,587,038 | 12/1996 | Cecchi et al. | 156/345 |
| 5,639,357 | 6/1997 | Xu | 204/298.08 |
| 5,650,032 | 7/1997 | Keller et al. | 156/345 |
| 5,669,975 | 9/1997 | Ashtiani | 118/723 I |
| 5,683,537 | 11/1997 | Ishii | 156/345 |
| 5,690,781 | 11/1997 | Yoshida et al. | 156/345 |
| 5,707,498 | 1/1998 | Ngan | 204/192.12 |
| 5,721,021 | 2/1998 | Tobe et al. | 427/570 |
| 5,753,044 | 5/1998 | Hanawa et al. | 118/723 I |
| 5,763,851 | 6/1998 | Forster et al. | 219/121.43 |
| 5,770,098 | 6/1998 | Araki et al. | 216/67 |
| 5,783,492 | 7/1998 | Higuchi et al. | 438/710 |
| 5,795,429 | 8/1998 | Ishii et al. | 204/298.08 |
| 5,810,931 | 9/1998 | Stevens et al. | 118/721 |
| 5,851,600 | 12/1998 | Horiike et al. | 118/723 I |
| 5,874,704 | 2/1999 | Gates | 204/298.08 |
| 6,042,700 | 3/2000 | Gopalraja et al. | 204/192.15 |
| 6,077,402 | 6/2000 | Liubo et al. | 204/192.12 |

OTHER PUBLICATIONS

U.S. patent application Ser. No. 09/049,276, filed Mar. 27, 1998 (Atty. Dk. 938.D2).

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac. Sci. Technol.*, vol. A7, pp. 151–158, 1989.

S.M. Rossnagel et al., "Magnetron Sputter Deposition with High Levels of Metal Ionization," *Appl. Phys. Lett.*, vol. 63, pp. 3285–3287, 1993.

J. Hopwood et al., "Mechanisms for Highly Ionized Magnetron Sputtering," *J. Appl. Phys.*, vol. 78, pp. 758–765, 1995.

S.M. Rossnagel, "Directional and Ionized Sputter Deposition for Microelectronics Applications," *Proc. of 3rd ISSP (Tokyo)*, pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

N. Jiwari et al., "Helicon wave plasma reactor employing single–loop antenna," *J. of Vac. Sci. Technol.*, A 12(4), pp. 1322–1327, Jul./Aug. 1994.

PCT International Search report mailed Sep. 2, 1999 in Application No. PCT/US 99/08368 filed Apr. 16, 1999.

U.S. application Ser. No. 08/971,867.

U.S. application Ser. No. 08/856,335.

U.S. Patent application No. 09/362,917 Filed Jul. 27, 1999 (Atty. Dkt 2326/7005).

PCT/US98/10058 Written Opinion Issued May 7, 1999 (Atty. Dkt 1752/5331).

Kim, Y.–W.,et al. "Directed Sputter Deposition of AlCu: Film Microstructure and Microchemistry," J. Vac. Sci. Technol. A 12(6), Nov./Dec. 1994; pp. 3169–3175.

Rossnagel, et al. "Metal ion deposition from ionized magnetron sputtering discharge," J. Vac. Sci. Technol. B, vol. 12, No. 1, Jan./Feb. 1994; pp. 3169–3175.

U.S. Ser. No. 09/251,690 filed Feb. 17, 1999.

SPUTTERING METHOD AND APPARATUS WITH SMALL DIAMETER RF COIL

BACKGROUND OF THE INVENTION

The present invention relates to plasma generators, and more particularly, to a method and apparatus for generating a plasma to sputter deposit a layer of material in the fabrication of semiconductor devices.

Plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent the target impact the surface of the target to dislodge, i.e., "sputter" material from the target. The sputtered materials are then transported and deposited on the surface of the semiconductor wafer.

Sputtered material has a tendency to travel in straight line paths, from the target to the substrate being deposited, at angles which are oblique to the surface of the substrate. As a consequence, materials deposited in etched openings including trenches and holes of semiconductor devices having openings with a high depth to width aspect ratio, may not adequately coat the walls of the openings, particularly the bottom walls. If a large amount of material is being deposited, the deposited material can bridge over causing undesirable cavities in the deposition layer. To prevent such cavities, sputtered material can be redirected into substantially vertical paths between the target and the substrate by negatively biasing (or self biasing) the substrate and positioning appropriate vertically oriented electric fields adjacent the substrate if the sputtered material is sufficiently ionized by the plasma. However, material sputtered by a low density plasma often has an ionization degree of less than 10% which is usually insufficient to avoid the formation of an excessive number of cavities. Accordingly, it has been found to be desirable to increase the density of the plasma in order to increase the ionization rate of the sputtered material and to decrease the formation of unwanted cavities in the deposition layer. As used herein, the term "dense plasma" is intended to refer to one that has a high electron and ion density, in the range of $10^{11}$–$10^{13}$/cm$^3$.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the primary winding of a transformer. The plasma acts as a single turn secondary winding of the transformer.

One approach has been to dispose the coil on the interior surface of the shield wall of the processing enclosure, or chamber, so that the plasma generating coil surrounds the volume, or space, enclosed by a surface that extends between, and contains, the edges of the target and the workpiece support surface. Thus, when the coil is installed within the chamber in accordance with this approach, it is positioned immediately adjacent to the chamber shield wall. Configuring the coil in the manner described above is based on the assumption that this promotes plasma uniformity adjacent the workpiece and that the uniformity, across the workpiece area, of the treatment effected with the sputtered ionized material depends on the plasma uniformity.

However, experience has shown that even when the plasma density is extremely uniform, the amount of deposition material delivered per unit workpiece surface area and per unit time, and hence the resulting thickness of the deposited film, tends to be greater at the center of the workpiece surface area than at the edge thereof, and diminishes progressively from the center to the edge.

Thus, although ionizing a relatively large portion of the deposition material facilitates deposition of material into high aspect ratio channels and vias, many sputtered contact metals have a tendency to deposit more thickly in the center of the wafer as compared to the edges. This "center thick" deposition profile is undesirable in many applications where a uniformity of deposition thickness is needed. It is believed that in the case of high density plasmas, the high gas pressures associated therewith produce a scattering effect which contributes to this "center thick" tendency.

To compensate for this center thick tendency, material may be sputtered from the coil itself. When the coil is located close to the chamber shield wall as discussed above, the coil will be closer to the periphery of the workpiece and farther away from the center of the workpiece. As a consequence, the deposition profile for material sputtered from the coil tends to be somewhat "edge thick." As a result, the center thick tendency of the target sputtered material can be compensated.

However, it is recognized that sputtering material from the coil may not be optimal for all applications. Accordingly, another approach for improving sputter deposition uniformity of ionized deposition material is needed.

BRIEF SUMMARY OF THE INVENTION

It is an object of the present invention to achieve improved film uniformity in such processing operations.

Another object of the invention is to achieve such improved uniformity in an economical and technologically simple manner.

A more specific object of the invention is to provide an inductively coupled plasma having an improved shape to promote processing uniformity.

The above and other objects are achieved by an apparatus for sputtering material onto a workpiece with the aid of a plasma which ionizes the material prior to deposition, which includes, in accordance with the present invention, an RF coil positioned to inductively couple RF energy into the plasma so that a substantial portion of the sputtered material passing adjacent said coil in the central portion of the chamber is ionized and attracted back to a biased target. As a consequence, it is believed that the relative deposition rate of material onto the central portion of the workpiece may be reduced and thereby improve the deposition uniformity.

In the illustrated embodiment, the coil has a reduced outer diameter which is believed to significantly increase the plasma density in the center of the chamber between the target and the substrate. As a result, a substantial portion of the sputtered material in the center of the chamber may be ionized sufficiently close to the target such that a bias on the target can attract many of the deposition material ions back to the target. In this manner, the deposition rate of ionized deposition material onto the center portion of the workpiece may be reduced to more closely match the deposition rate at the periphery of the workpiece.

In another aspect of the present invention, the coil diameter may be reduced such that it is smaller than the outer diameter of the workpiece. It is believed that the resultant plasma density outside the perimeter of the coil will be substantially reduced as compared to the plasma density in the interior of the coil. As a result, it is believed that sputtered deposition material traveling outside the coil in a path directed toward the substrate will tend to be ionized closer to the workpiece than deposition material traveling though the interior of the coil. Consequently, the deposition material ionized at the periphery of the chamber will tend to be attracted to the workpiece rather than the target. Hence, the deposition rate at the periphery may be substantially maintained.

DETAILED DESCRIPTION OF THE INVENTION

Figure 1:
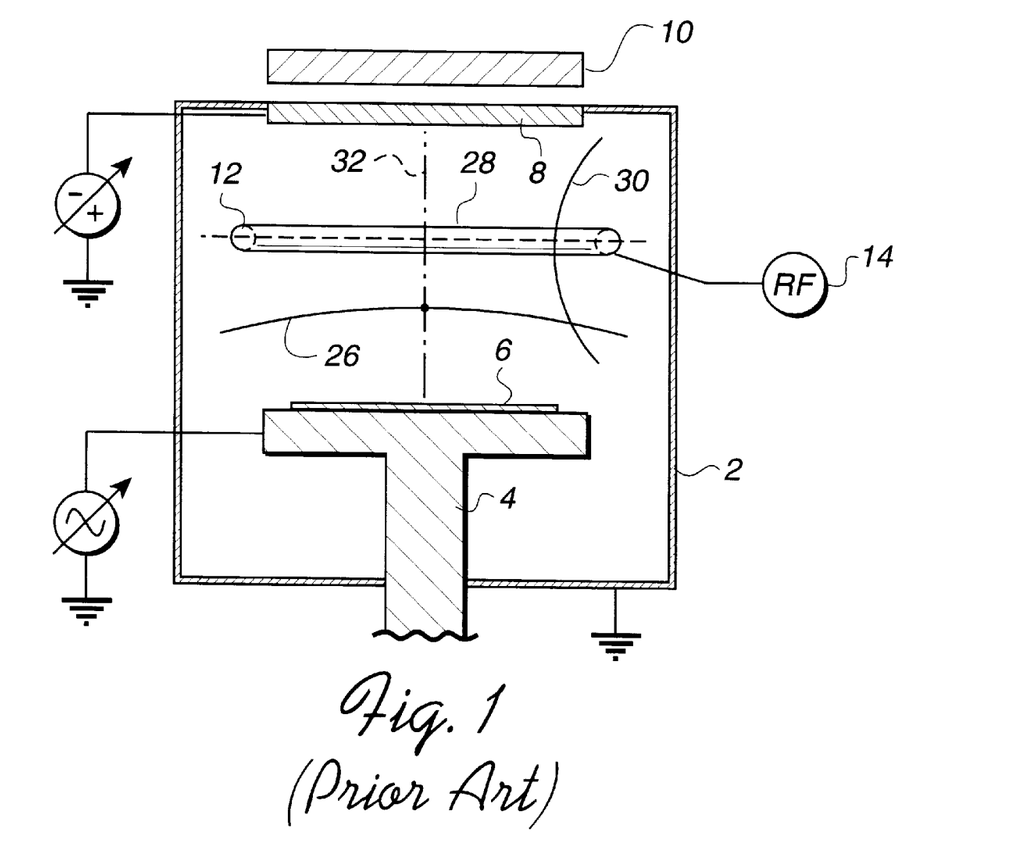
FIG. 1 is an elevational pictorial view illustrating apparatus having an RF coil according to a prior approach and showing a typical plasma density distribution for such a processing chamber coil.

FIG. 1 shows the basic components of a prior device for processing workpieces in an inductively coupled plasma as described in copending application Ser. No. 08/644,096, entitled "Coils for Generating a Plasma and for Sputtering," filed May 10, 1996 abandoned, and assigned to the assignee of the present application, which application is incorporated herein by reference in its entirety. These include a processing chamber 2 and a workpiece support member 4 supporting a workpiece 6, a sputtering target 8, a magnet assembly, or magnetron, 10 which produces a magnetic field to promote the sputtering of material from target 8, and a coil 12 which generates an RF magnetic field required to ignite and maintain a plasma.

As described therein, a plasma can be generated in chamber 2 when a processing gas, such as argon, at a sufficient pressure is subjected to an appropriate RF field produced by coil 12 to ionize the gas. Also, coil 12 may be cooled by establishing a flow of water through a passage formed internally of coil 12.

RF current is supplied to coil 12 from an RF power source 14 via an appropriate matching network, each of which may be conventional in the art.

Target 8 is generally made of a metal, such as titanium, which is to be deposited as a layer, or film, on the workpiece. Workpiece support member 4 and target 8 are usually biased to provide negative potentials on the workpiece and target, respectively, as illustrated, while chamber 2 has, or constitutes, a generally cylindrical conductive shield 9 (FIG. 2) maintained at ground potential.

The magnetic field produced by magnet assembly 10 entraps electrons which collide with gas atoms to ionize the atoms, which are then attracted to, and strike, the surface of target 8, which ions bombard target 8 to dislodge atoms of the metal. These atoms are ionized in the plasma and the resulting metal ions, having a positive polarity, are attracted to workpiece 6 with the aid of the negative bias potential effected on the workpiece by support member 4.

Workpiece 6 is typically constituted by one or more semiconductor wafers.

Figure 2:
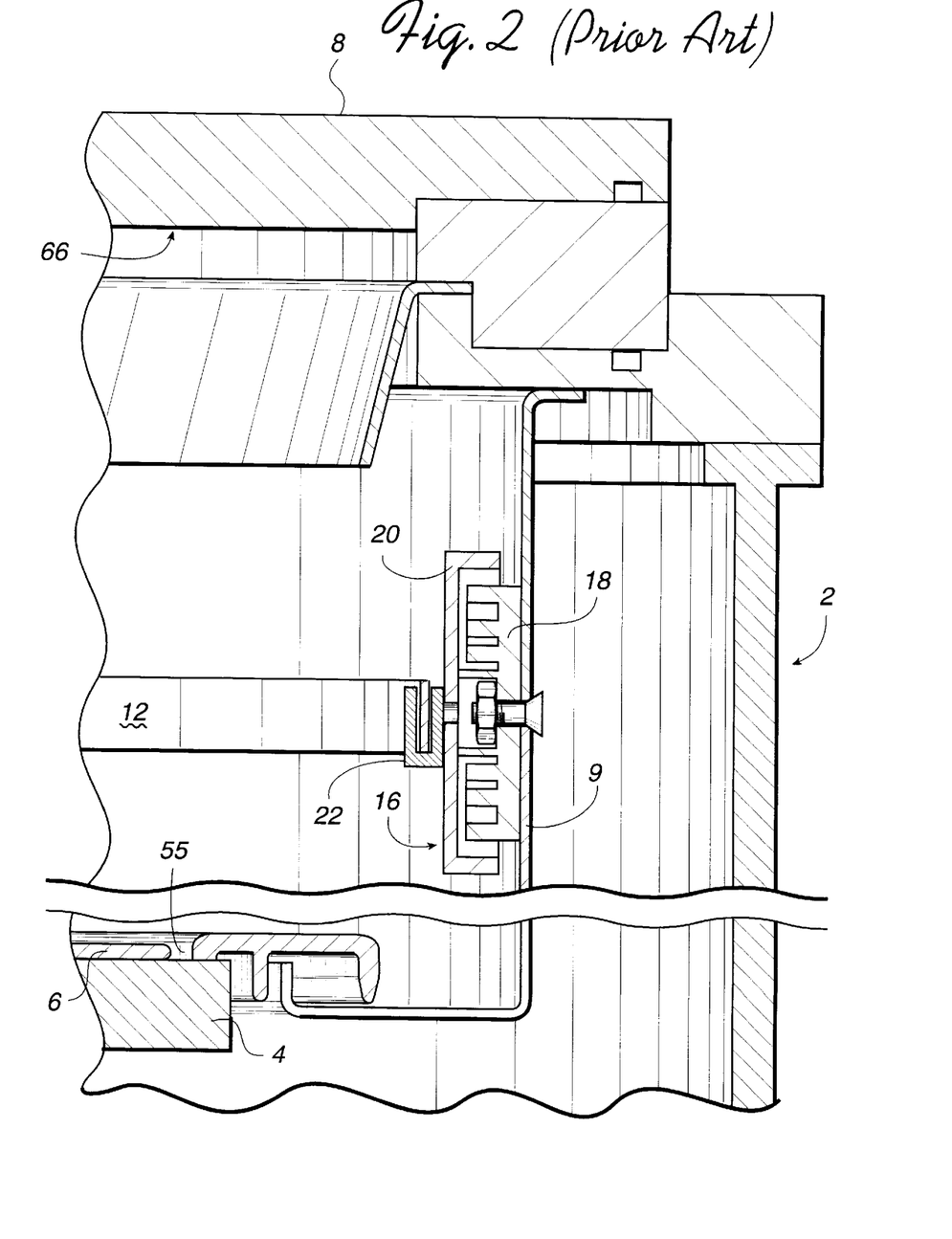
FIG. 2 is a partial cross-sectional view of the coil and chamber of FIG. 1.

As best seen in FIG. 2, the coil 12 in prior approaches has tended to have a diameter slightly smaller than that of the shield 9 so as to minimize deposition of target material onto the coil 12. Hence, the coil 12 has been conveniently supported adjacent to the shield 9 by small standoffs 16 which electrically insulate the coil 12 from the grounded shield 9.

The coil standoff 16 includes a generally disk-shaped base member 18 which is preferably made of an insulative dielectric material such as a ceramic. Covering and shielding the base member 18 is a generally cylindrically shaped cover member 20 which is preferably made of the same material which is being deposited. Hence, if the material being deposited is made of titanium, the cover member 20 is preferably made of titanium as well. To facilitate adherence of the deposited material (here for example, titanium), it is preferable to treat the surface of the metal by bead blasting which will reduce shedding of particles from the deposited material.

Affixed to the front of the cover member 20 is a generally hook shaped bracket 22 of bead blasted titanium which receives and supports a turn of the coil 12. The base member 18 is shown attached to the wall of the shield 9 by a bolt or other suitable fastener. The base member 18 and the cover member 20 together define a labyrinth structure which inhibits the formation of a conducting path across the standoff which could short the coil to the shield.

In the example of FIG. 2, the coil 12 is often spaced from the shield wall 9 by a distance of approximately 1 cm or less. Thus, for a shield having an inner diameter of 33 cm, the coil outer diameter has often been 30 cm or more, depending upon the application. Hence, the outer diameter of the coil carried internally by the shield wall has often been approximately 90% of the shield inner diameter.

The plasma in chamber 2 has a characteristic density pattern. The precise form of the pattern is dependent on a number of factors, including coil, target and workpiece support geometry and RF current magnitude and frequency.

One exemplary density pattern is indicated in FIG. 1. Curve 26 represents the plasma density profile, or variation, along a horizontal line 28, and curve 30 represents the plasma density profile, or variation, along a vertical line 32. These curves indicate that the plasma density has a maximum value at the center of coil 12 and decreases in horizontal directions away from that center and in vertical directions away from the plane of coil 12.

In FIG. 1, coil 12 is a planar, single turn coil. Line 28 was chosen to lie in the coil plane and line 30 was chosen to correspond to the coil axis, which corresponds to the center axis of chamber 2. Curves showing plasma density along other lines offset from lines 28 and 30 would have forms similar to those shown, although these curves might exhibit a smaller amplitude excursion.

Because of the higher plasma density near the axis of coil 12, atoms sputtered from the center region of target 8 tend to be ionized more quickly and at a higher rate than ions sputtered from the edge region thereof. In addition, the high pressure at the plasma tends to physically scatter sputtered material towards the center. These phenomena are believed to be responsible for a higher rate of delivery of ionized target material to the center region of the workpiece support area than to the edge region thereof. In addition, it is believed that if the plasma density near the axis of coil 12 is sufficiently high, some sputtered ions may become ionized above the coil and may then be attracted back to target 8. However, if this occurs when coil 12 has the configuration shown in FIG. 1 and when the usual plasma density levels exist in chamber 2, it is believed that the quantity of ions deflected back to the target will not offset the larger quantity of ions delivered to the center region of the workpiece.

Figure 3:
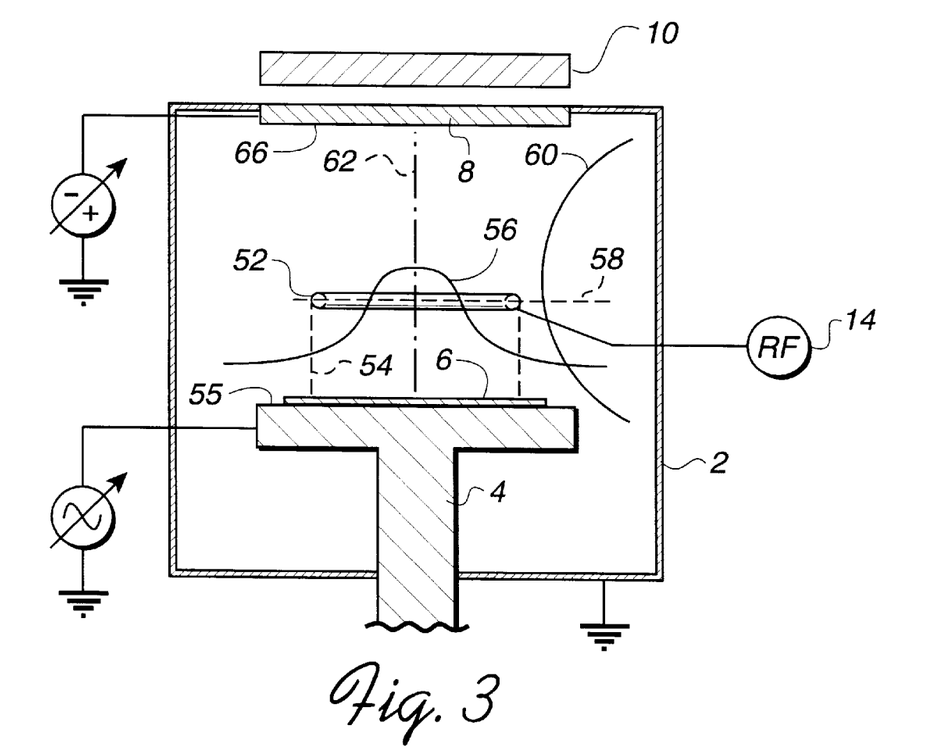
FIG. 3 is a view similar to that of FIG. 1 illustrating an embodiment of apparatus according to the present invention and showing the plasma density distribution in a processing chamber containing a coil according to one embodiment of the invention.

In one aspect of the present invention, it has been recognized that this effect of a high plasma density can be utilized to reduce nonuniformity between the center region and the edge region of the workpiece support area as regards the rate of delivery of sputtered target material ions. This can be achieved, according to preferred embodiments of the invention, by providing a plasma generating coil which has a smaller diameter than those previously employed in many prior applications. FIG. 3 shows such an embodiment in which a coil 52 is disposed within a cylindrical volume that is enclosed by an imaginary surface 54 that extends perpendicularly from the surface 55 of the workpiece support 4.

The embodiment shown in FIG. 3 differs from the system shown in FIG. 1 in that coil 12 of FIG. 1 is replaced by a coil 52 having the above-described smaller diameter and, possibly, located at a greater distance than coil 12 from target 8. Because of this smaller diameter, and when a suitable RF current magnitude is supplied, coil 52 produces a density pattern depicted by curve 56 which represents the plasma density variation along a horizontal line 58 that lies in the coil plane and curve 60 which represents the plasma density variation along a vertical line 62 that extends along the coil axis.

With the coil configuration shown in FIG. 3, the plasma density is much higher inside of coil 52 than it is outside the coil. In addition, the plasma density decreases more steeply in the axial direction from the coil plane. It is believed that the radial plasma gradient represented by curve 56 can cause atoms sputtered from the center region of target 8 to be ionized sooner, i.e. closer to the sputter source (the target), than ions sputtered from the target edge region. In the illustrated embodiment, the target center region is centered at the target center and has a radius which is substantially the same as that of the coil radius. A high percentage, e.g., more than half, of the atoms sputtered from the center of target 8 can be ionized before they reach the coil plane, where the plasma density peaks, and can therefore be redirected, or retracted, back and redeposited onto target 8 due to the axial field gradient exerted by the target bias. The majority of the material sputtered from the target center region which is not redirected back to the target will pass through the coil.

By comparison, atoms sputtered from the edge of target 8 can travel over longer paths before they are ionized because of the sharply lower plasma density at the edge. As a consequence, ionization tends to occur later such that even if atoms are ionized prior to passing the coil plane, they have a higher probability of passing the plane of coil 52 outside of the region enclosed by coil 52 and coming under the influence of the workpiece bias to follow the axial field gradient of the workpiece to the workpiece surface. They also have a higher probability of remaining intact (i.e., not ionized) until they pass the coil plane where, once ionized, they are more likely to be attracted to the workpiece by virtue of the bias on support member 4. Additionally, a greater percentage of atoms sputtered from the target and passing outside of the region enclosed by the coil will not be ionized and thus not affected by the bias, as compared to those sputtered atoms passing through the coil where plasma density is highest.

The relative size of the coil and the biases on the coil, the target and the workpiece and/or workpiece support will dictate the probability of an atom sputtered from the target, once ionized at any particular location between the target and the workpiece, returning to the target or traveling on to the workpiece.

Since a high percentage of the atoms sputtered from the center of target 8 can be redirected back toward the target, the density of ion flow, or flux, to the workpiece surface from the center of target 8 may be reduced relative to the flux from the edge of target 8. Since sputtered materials, once ionized, tend to travel along straight lines perpendicular to the surface of target 8 (or other biased chamber components), the result can be an improvement in the uniformity, across the workpiece support surface, of the delivery of ions of sputtered material.

Thus, the configuration of the plasma gradient produced by a coil according to the present invention increases the proportion of material sputtered from the edge, or peripheral region, of the target to reach the corresponding peripheral region of the workpiece surface as compared to that which reaches the same region using a larger diameter coil. As set forth above, this is due to the fact that the lower plasma density in the area outside of coil 52 is less likely to cause ions of sputtered material to be redirected back to the target and to permit a greater portion of non-ionized particles, whose travel paths are more ballistic, to pass through this region. By comparison, the higher plasma density in the interior of the coil increases the chances of the material sputtered from the central region of the target being ionized and redirected back to the target.

Figure 4:
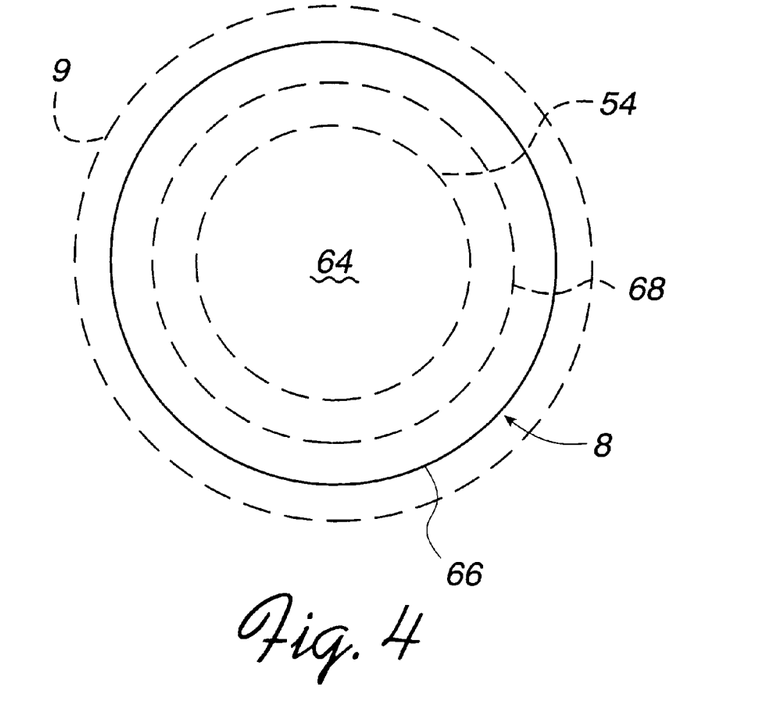
FIG. 4 is a bottom view of the sputtering surface of the target of the chamber of FIG. 3.

FIG. 4 shows an example of one such target central region which is a circular-shaped region 64 centered at the center of the target sputtering surface 66 and having a diameter which coincides with the outer diameter 54 of the coil. Of the material sputtered from the target central region 54, a substantial portion, such as one half or more, of the material sputtered from the central region 64 of the target may be ionized sufficiently early to be redirected back to the target 8.

As a result, an overall ionization rate may be maintained while improving uniformity to promote travel of ions of sputtered material along paths perpendicular to the workpiece surface. This promotes the deposition of a uniform layer of sputtered material at the bottoms of high aspect ratio grooves formed in the workpiece surface.

Such uniformity can be optimized, in a given apparatus, by selection of appropriate values for the coil diameter, the gas pressure within chamber 2, the RF power supplied to coil 52 and the target to coil spacing. This latter spacing may be dependent to some extent on the target to workpiece surface spacing.

As shown in FIG. 4, the diameter 54 of the imaginary surface which encloses the coil 12 may be somewhat smaller than that of the diameter (indicated at 68) of the workpiece and substantially smaller than the diameter of the shield 9. Alternatively, the diameter 54 of the imaginary surface may coincide with that of the workpiece diameter 68 or may be somewhat larger than that of the workpiece 6. Presently contemplated desirable values for certain of the above parameters include:

a coil outer diameter of 10 cm (4") to 25.4 cm (10") for a shield diameter of 33.5 cm (13.2") which is suitable for a workpiece surface which can accommodate workpiece diameters of 20 cm (8") or 15.2 cm (6");

a spacing from the lower, or sputtering, surface of target 8 to the top of coil 52 of 2 cm (0.75") to 6.3 cm (2.5"), for a target to workpiece spacing of 14 cm (5.5").

As one example, a coil outer diameter of 22.9 cm (9") was found to be suitable for a workpiece surface which can accommodate a workpiece diameter of 20 cm (8").

Considered as a percentage of shield diameter, desirable values for the coil outer diameter may range, for example, from approximately 30% of the shield inner diameter to approximately 75% of the shield diameter. Thus, for larger shields which can accommodate larger workpiece support surfaces for larger workpieces such as 12" diameter wafers, it is contemplated that the desirable coil diameters would be correspondingly higher. For example, for a 43.2 cm (17") diameter shield, it is contemplated that the coil diameter may range from approximately 13 cm (5.1") to 32.4 cm (12.75").

In some applications, it may be desirable for the coil outer diameter to not exceed the outer diameter of the target. In such applications, the coil outer diameter may range, for example, considered as a percentage of target diameter, from approximately 30% of the target diameter to approximately 100% of the target diameter.

In some applications, it may be desirable for the coil outer diameter to not exceed the outer diameter of the workpiece. In such applications, the coil outer diameter may range, for example, from ½ to $^{15}/_{16}$ of the workpiece outer diameter.

Another factor which may affect the desired coil diameter is the particular process being performed. For example, in a titanium nitride deposition process which typically includes providing a nitrogen gas component in addition to a plasma precursor gas such as argon, the additional nitrogen gas may increase the pressure within the chamber, thereby increasing scattering of the sputtered material and increasing the degree of nonuniformity of the deposition. To offset such increased scattering, it may be useful to further decrease the coil diameter to decrease further the relative supply of sputtered material to the center area of the workpiece.

In the illustrated embodiment, the coil 52 is centered with respect to the expected center of the workpiece when placed onto the workpiece support surface 55. In addition, the coil 12 is shown as generally parallel to the workpiece.

Figure 5:
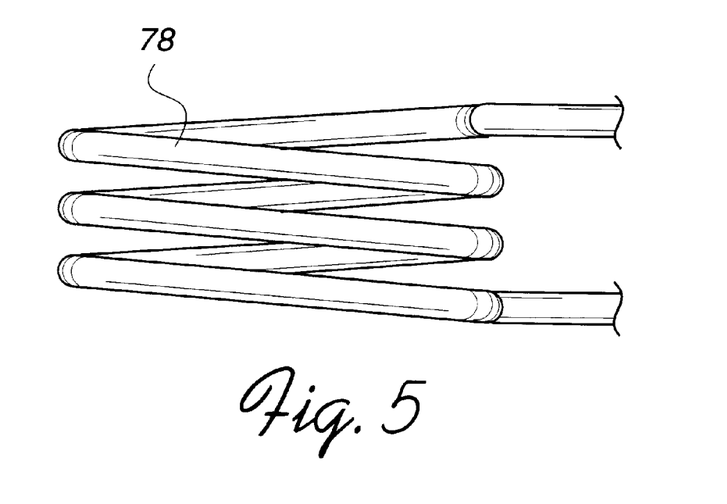
FIG. 5 is an elevational view of a second embodiment of a coil according to the invention.

While coil 52 may be, as illustrated, a single turn coil, a coil 78 in the form of a multi-turn spiral can also be employed in the practice of the invention, as shown in FIG. 5. Preferably, all turns of coil 78 have the same diameter, however, a spiral shaped coil may also be used. The coil member may have a variety of shapes including tubular, ribbon or bar shaped, for example.

While particular embodiments of the present invention have been shown and described, it will be apparent to those skilled in the art that changes and modifications may be made without departing from this invention in its broader aspects and, therefore, the aim in the appended claims is to cover all such changes and modifications as fall within the true spirit and scope of this invention.

What is claimed is:

1. An apparatus for processing a workpiece, the apparatus comprising:
   a chamber enclosing a plasma generation area;
   a target having a sputtering surface facing said workpiece and constituting a source of material to be sputtered and adapted to be biased to attract ions;
   a workplace support adapted to support said workpiece;
   an RF coil adapted to inductively couple RF energy into a plasma, said RF coil being positioned between said target sputtering surface and said workpiece support so that an amount of sputtered material from said target is ionized;
   a shield having an inner diameter surrounding at least a portion of said RF coil;
   said RF coil having an outer diameter that is less than that of said target sputtering surface, and said RF coil outer diameter does not exceed 75% of said shield inner diameter, so that at least a portion of said ionized material is transported back towards said target.

2. The apparatus of claim 1 wherein said target sputtering surface has a center region and wherein at least one half of said sputtered material from said center region is ionized and transported back towards said target.

3. The apparatus of claim 1 wherein said shield is grounded.

4. The apparatus of claim 3 wherein said target is located above said RF coil in said chamber and said RF coil outer diameter is at least 30% of said shield inner diameter.

5. The apparatus of claim 2 wherein said RF coil has an outer diameter and is also positioned so that a portion of said sputtered material from said target is ionized and travels in a path outside said outer RF coil diameter and is deposited onto said workpiece.

6. The apparatus of claim 5 wherein said target includes a target region directly on a line of sight with a workpiece region outside of said RF coil.

7. An apparatus as in claim 1, wherein said RF coil has an outer diameter which is about one half that of said workpiece.

8. The apparatus of claim 2 wherein said coil defines a coil radius, and wherein said central region of said target is a circular-shaped region having a radius which is substantially the same as said coil radius.

9. The apparatus according to claim 1 wherein said workplace has a workplace center, and said coil has an outer diameter which is smaller than that of said workpiece, and said coil has a coil center which is coaxial with said workpiece center.

10. The apparatus according to claim 9 wherein said outer diameter of said coil is between ½ and $^{15}/_{16}$ that of said workpiece.

11. The apparatus according to claim 1 wherein said coil is a single turn coil.

12. The apparatus according to claim 1 wherein said coil has a plurality of turns all having the same diameter.

13. An apparatus for processing a workpiece, the apparatus comprising:
    a chamber enclosing a plasma generation area;
    a target having a sputtering surface facing said workplace and constituting a source of material to be sputtered and adapted to be biased to attract ions;
    a workplace support adapted to support said workpiece;
    an RF coil for inductively coupling RF energy into a plasma, said RF coil being positioned between said target and said workplace support so that an amount of sputtered material from said target is ionized; and
    a shield having an inner diameter surrounding at least a portion of said RF coil;
    wherein said RF coil has an outer diameter that is 30 to 75 percent of the inner diameter of said shield and smaller than said target and said workpiece, so that at least a portion of said ionized material is directed back towards said target.

14. An apparatus as in claim 13, wherein said shield is grounded.

15. An apparatus as in claim 14, wherein said RF coil diameter is about ½ that of said workpiece.

16. An apparatus as in claim 13, wherein said RF coil is a single turn coil and is positioned to be parallel to said target sputtering surface and said workpiece support.

17. An apparatus as in claim 13, wherein said target and workpiece are separated by approximately 14 cm, and said target and RF coil are separated by approximately 2 to approximately 6.3 cm.

18. An apparatus as in claim 13, wherein said sputtering surface includes a central region having a diameter equal to that of said coil and at least one half of said sputtered material from said central region is redirected towards said target.

19. A method for sputter depositing a layer on a workplace in a chamber, comprising:

providing a target said chamber so that at least a portion of said target and said workpiece directly face one another;

positioning an RF coil in said chamber at a location between said target and workplace, said RF coil having a smaller outer diameter than that of said target;

positioning in said chamber a shield having an inner diameter surrounding at least a portion of said RF coil so that said RF coil outer diameter is 75% or less of said shield inner diameter;

supplying energy to said RF coil to form a plasma having a plasma density gradient therein;

sputtering said target to form sputtered material;

wherein said plasma density gradient directs a first amount of said sputtered material from a central region of said target back towards said target and said plasma density gradient directs a second amount of said sputtered material from an outer region of said target back towards said target, wherein said first amount is greater than said second amount.

20. A method as in claim 19, wherein said sputter depositing is controlled to form a uniform layer of said sputtered material on said workpiece.

21. A method as in claim 19, further comprising grounding said shield.

22. A method as in claim 19, wherein said first amount of said sputtered material is at least 50% of said material sputtered from said central region.

23. A method as in claim 19, wherein said positioning in said chamber a shield includes positioning said shield so that said RF coil outer diameter is 30% to 75% of said shield inner diameter.

24. A method as in claim 19, wherein said positioning an RF coil in said chamber comprises positioning a single turn RF coil in said chamber.

* * * * *